United States Patent [19]

Delache et al.

[11] Patent Number: 4,974,918

[45] Date of Patent: Dec. 4, 1990

[54] DEVICE WITH OSCILLATING MIRRORS FOR DEVIATING ELECTROMAGNETIC BEAMS

[75] Inventors: Alain Delache; Véronique Castelo, both of Nice, France

[73] Assignee: Techneme SaRL, France

[21] Appl. No.: 288,483

[22] Filed: Dec. 22, 1988

[30] Foreign Application Priority Data

Dec. 24, 1987 [FR] France .................................. 87 18469

[51] Int. Cl.$^5$ .............................................. G02B 26/10
[52] U.S. Cl. ...................................... 350/6.6; 350/486; 310/38
[58] Field of Search ................. 350/6.6, 6.5, 486, 487, 350/632, 633; 355/84; 310/36, 37, 38, 39; 250/347

[56] References Cited

U.S. PATENT DOCUMENTS

| | | | |
|---|---|---|---|
| 4,073,567 | 2/1978 | Lakerveld | 350/6.5 |
| 4,659,932 | 4/1987 | Roll | 350/6.6 |
| 4,690,486 | 9/1987 | Roll et al. | 350/6.6 |
| 4,738,500 | 4/1988 | Grupp et al. | 350/6.6 |

FOREIGN PATENT DOCUMENTS 2056989 6/1972 Fed. Rep. of Germany .
2557814 4/1977 Fed. Rep. of Germany .
84/03823 10/1984 World Int. Prop. O. .

OTHER PUBLICATIONS

Forschung und Technik, 4 Apr. 1984, No. 10, Magnete aus Neodym-Eisen, p. 66, Zurich, CH.

Primary Examiner—Bruce Y. Arnold
Assistant Examiner—Loha Ben
Attorney, Agent, or Firm—Ostrolenk, Faber, Gerb & Soffen

[57] ABSTRACT

A device for deviating an electromagnetic beam. The device includes a mirror for reflecting the electromagnetic beam; and first, second and third magnets for generating a magnetic field. The second magnet is located between the first and third magnets. The device further includes a winding which is located within the magnetic field and which is fixed to the mirror. An elastic support is provided for elastically supporting the mirror with respect to the second magnet. Electric current is supplied through the winding to cause the mirror to oscillate with respect to the magnets.

17 Claims, 3 Drawing Sheets

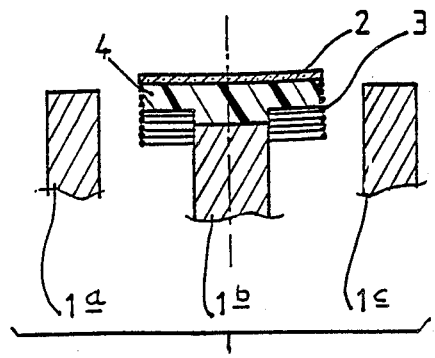
Fig. 3ᵃ
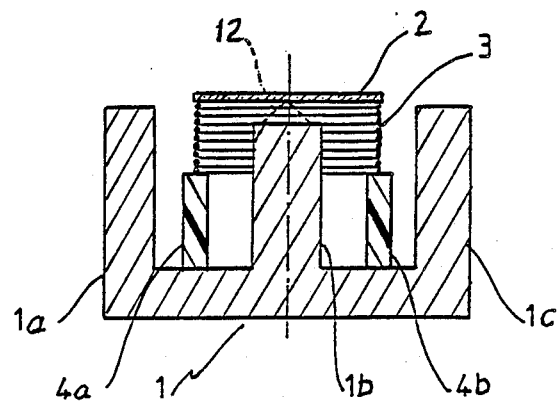
Fig. 3ᵇ
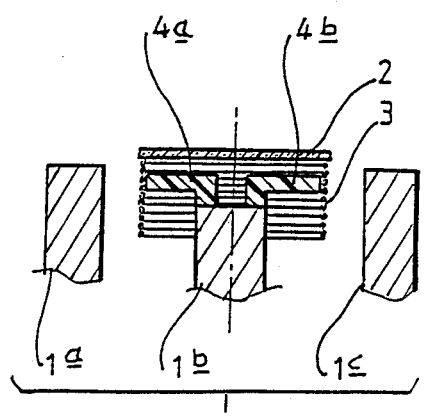
Fig. 3ᶜ

DEVICE WITH OSCILLATING MIRRORS FOR DEVIATING ELECTROMAGNETIC BEAMS

BACKGROUND OF THE INVENTION

The present invention relates to an oscillating mirror device for the deviation of electromagnetic beams.

We know that devices related to galvanometers have been for some time installed in different technical sectors: such as the first oscilloscopes being operated with oscillating mirrors.

Such devices are generally made up of rotating mirrors mounted on an axis and piloted by either high speed motors, or by electromagnets.

The need to increase the performance of these systems has brought applicants toward the finalization of a device susceptible of having an easily controlled and modulated mirror oscillating at high speed.

SUMMARY OF THE INVENTION

The device according to the invention fulfills this requirement for it allows the vibration of a mirror from 0 to many kilo-Hertz, thus opening the possibility for numerous applications which will be described further on.

The device according to the invention has a mirror bound up with a winding located in an intense magnetic field and susceptible of oscillating at great frequencies on a support made from an elastic material, on which the mirror-winding assembly is fixed by gluing.

Use of an elastic support and an intense magnetic field presents a number of remarkable advantages compared to existing devices, so much in the oscillating speed previously stated as much as for the reliability and the compactness of the system, as well as for the electrical power it requires for its operation.

In fact, while assuring the oscillating damping of the mirror-winding assembly, the elastic support allows avoidance of friction or rotating mechanical parts, such as ball bearings which deteriorate progressively in time; the result is exemplary reliability.

In addition, the control means of the device does not require the use of a great electronic power assembly as is the case with existing devices; only a few watts are sufficient to pilot the present device.

This fact, in addition to the simplicity of the device, allows the system according to the invention to present the supplemental advantage of considerably reduced compactness—down to miniaturization. The volume of the assembly can be less than one tenth that of existing systems (around 12 mm × 10 mm × 15 mm).

Finally, the device according to the invention also offers the advantage of an operating linearity from 0 Hertz to many kilo-Hertz. Most existing systems operate on one frequency only.

All of the advantages which have been exposed bring about exceptional performance of the device according to the invention, which can be miniaturized to extreme, such exceptional performance being due, as it has previously been said, to the joint application of high power magnets and elastic support for the mirror.

The magnets applied in the device according to the invention are in fact magnets producing power greater than 100 kj/m$^3$, which is able to create magnetic fields of great intensity.

These magnets are made from magnetic material type Neodymium-steel whose energy product can go over 200 kj/m$^3$.

The magnets can be constituted of an assembly of two magnets; one has been given a "U" shape and the other a parallelepiped shape and placed in the interferric space of the first one.

They can also be constituted of three calcine plates of magnetic material type Neodymium-steel arranged in a parallel manner on the support. They may be made from the same material.

They can also be constituted of a single block with a rough "E" shape

In either case, the mirror support is fixed on the middle element by gluing with an appropriate glue which can be a cyanoacrylate ester type, the mirror-winding assembly capping the top of the support.

The elastic support can be made either from a purely elastic material or presenting al low damping coefficient, or a material presenting a high damping coefficient, depending on the desired response.

In the case when the mirror support is made from an elastic material presenting a high damping coefficient, the system can present a particularly satisfactory response curve, such as the one represented in FIG. 2, where i(t) indicates the current intensity going through the winding, a(t) the angular response of the mirror and $\tau$ the time to energize the system up to 63%.

The material used in this case is preferably a polyurethane commercialized under the name of "SORBOTHANE".

In the case when the mirror support is made from purely elastic material or presenting a low damping coefficient, the system can be used only to its proper resonance frequency, unless its electronic control integrates a filter to control the resonance of the system.

The material used in this case can be any elastic material such as natural latex or synthetic elastomer latex such as "styrene-butadiene" or "styrene-butadiene-styrene".

This elastic support, as previously stated, supports the mirror-winding assembly which is fixed with an appropriate glue, such as cyanoacrylate ester.

The mirror is preferably a mirror combining lightness, rigidity, heat resistance and optical performance.

The material used as reflecting surface support can be made from extremely fine glass with a thickness less than 0.2 mm, from beryllium with a thickness less than 0.4 mm or polysulfone.

The silvering or aluminum plating making up the reflecting surface of the mirror preferably presents as large as possible reflecting spectrum so as to reflect everything from infrared to X-ray beams.

The winding is made of a metallic conductor such as copper or high conducting complex alloy.

The metallic conductor can have the shape of a wire in which the case the winding is formed of spires superposed in one or two layers.

The wire can be very fine (approximately a few hundredths of a millimeter in diameter) for a very miniaturized device. We can thus use, as an example, a 4/100 mm diameter enamelled copper wire, formed of 100 spires superposed in two layers.

The winding can also consist of an incrustation on the material making up the support for the reflecting surface of the mirror, in which case the mirror occupies the central portion of this support and is surrounded by the incrustation making up the winding, which takes on the approximate shape of a spiral.

In the case when the winding is made of a metallic wire formed of spires, it is preferably made without support, in such a manner as to contribute to the lightness of the device.

In this case the mirror is fixed on the winding by gluing with an appropriate glue such as a cyanoacrylate ester, this gluing being preferably done on two opposite sides of the polygon formed by the spires.

The mirror-winding assembly is, as previously stated, fixed by gluing on the elastic support, being itself also fixed by gluing onto the middle magnet of the magnet assembly.

This fixing of the mirror-winding assembly on the elastic support can be done in different ways corresponding to different configurations of the elastic support. The fixing can thus be done either on the mirror alone or together on the mirror and the winding.

Thus, in a first embodiment, the winding takes on the rough shape of a rectangular parallelepiped, the mirror is glued into the two long sides of the rectangular which make up the upper face of this parallelepiped and the mirror-winding assembly caps the middle magnet of the magnet assembly.

The elastic support can have the shape of a rectangle parallelepiped, a barrel, a spool or any other appropriate shape and be fixed only on the mirror.

According to another embodiment, the elastic support can be constituted of a block glued onto the mirror and the winding.

According to still another embodiment, the elastic support can be made of two reversed L-shaped elements, each being fixed on one hand to the middle magnet and on the other to an internal face of the parallelepiped configuration of the winding.

According to another embodiment, the elastic support can be made of two elements located on each side of the middle magnet and supporting two opposite sides of the parallelepiped configuration of the winding.

In another embodiment, the winding is made up of metallic incrustations arranged, around the mirror, on the surface that supports the silver plating or aluminum plating.

In this embodiment, the mirror is fixed onto the elastic support (which can take on the shape of a rectangle parallelepiped, a barrel or a spool and which is fixed on the middle magnet).

In all cases, the winding is supplied by an electrical current or voltage source, equipped with means for modulating the intensity, the frequency and the type of current allowed in the winding. Under the action of the electrical current and the magnetic field, the mirror starts to oscillate at a frequency equal to that of the current, the amplitude of the oscillations depending at the same time on the intensity of the magnetic field and the maximum amplitude of the current.

These parameters being suitably chosen, the mirror oscillations can be advantageously used to deviate electromagnetic beams, the piloting of the assembly being realized by appropriate electronic means.

A particularly advantageous feature of the invention, guaranteeing its reproducibility, consists of associating with the winding interdependent of the mirror a secondary winding of smaller size bound up to one of the two faces of the winding which is located in the interferrics formed by the three parallel magnets and positioned in such a manner that it cannot recover any induction current through the main magnet, the only current appearing in the secondary winding being the one induced by its own displacement within the magnetic field created by the magnets.

A correct treatment of this current by an appropriate slaving mode allows an adjustment for instantaneous speed position and acceleration of the mirror, fulfilling the linearity requirements of the system.

The slaving mode can be either a numerical slaving mode or an analog slaving mode, such as a proportional slaving, a derived slaving, an integral slaving, a proportional derived slaving, an integral proportional slaving, a derived integral slaving or derived integral proportional slaving.

As an example of such a slaving mode, we can state the derived proportional slaving mode which consists of a variable gain amplifier followed by a voltage subtractor for subtracting the voltage corresponding to the current of the control voltage of the main winding, which creates an adjustable electronic brake which also allows an adjustable slaving of the instantaneous position of the mirror.

The secondary winding advantageously takes on a rectangular shape and its disposition in relation to the main winding is advantageously such that the plane of its spires is perpendicular to the whole of the parallel planes defined by the main winding spires.

There may be anywhere from 1-10 of the secondary winding spires. Two spires will be sufficient most of the time to give satisfying results.

These spires can be either superposed or juxtaposed, being wound around the rectangle which defines their shape. In this latter case they are positioned in the same plane which allows a considerable gain in thickness.

The device according to the invention can find numerous applications in all technical fields apt to call for deviation of electromagnetic beams, whether for their transmission or their reception. For example:
  in transmission : deviation of a laser beam with the aid of a double device, either for the realization of drawings or graphs on any type of support or, in the case of high power lasers, for the realization of cut-outs or engraving.
  in reception : sweeping of the plane or a volume for infrared cameras.
  in transmission-reception : reconnaissance of shapes with lasers or X-rays : laser copiers, photocopiers.

BRIEF DESCRIPTION OF THE DRAWINGS

FIGS. 3a, 3b, 3c are transverse cross sectional views of the device according to the invention.

DETAILED DESCRIPTION OF THE PREFERRED EMBODIMENTS

Figure 1:
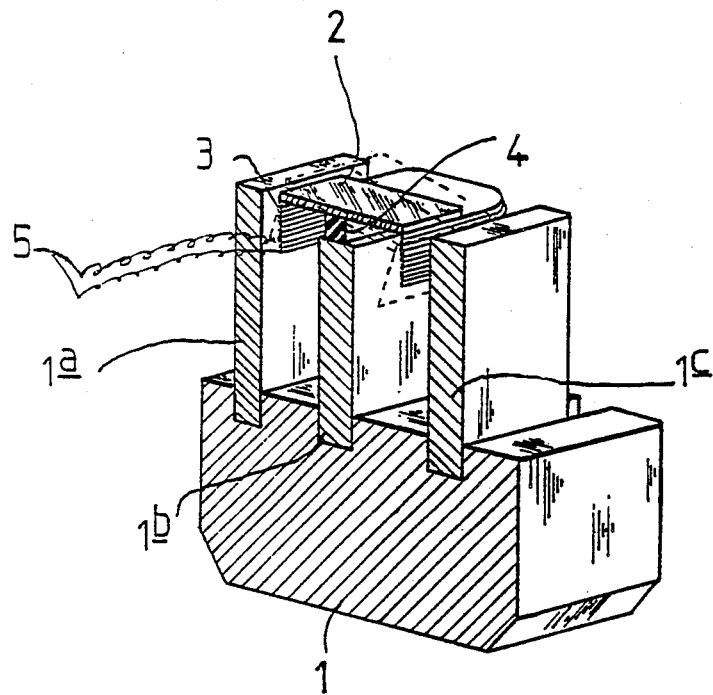
FIG. 1 is a transverse cross sectional perspective view of a device according to the invention.

The device illustrated in FIG. 1 has a magnet 1. The magnet 1 has two exterior magnets 1a and 1c and a middle magnet 1b.

A mirror 2 is glued onto a winding 3. The winding 3 is supplied with current by electric wires 5. The mirror 2 is also glued into the elastic support 4. The elastic support is glued onto the middle magnet 1b.

When electric current is applied to the winding 3, the mirror-winding assembly oscillates between two extreme positions one of which is represented by dots.

Figure 2:
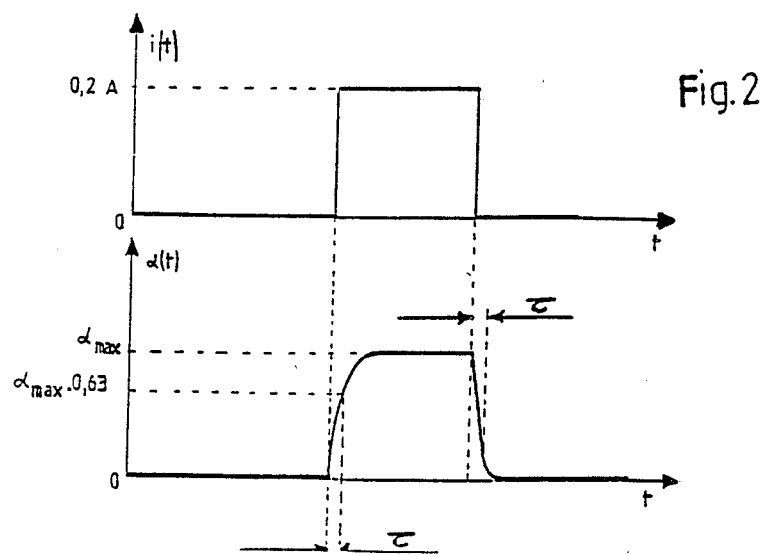
FIG. 2 illustrates a response curve of the device according to the invention.

FIG. 2 represents a response curve for the device when the mirror support is made from a high damping coefficient elastic material. i(t) designates the current intensity through the winding, $\alpha(t)$ the angular response of the mirror and $\tau$ the time for energizing the system up to 63%.

As we can ascertain while examining this curve, the response curve of the device at a rectangular current is particularly satisfying, the time for energizing the system up to 63% being very short.

The elastic support 4 illustrated in FIG. 3a includes a block which is fixed to the mirror 2 and the winding 3.

The elastic support illustrated in FIG. 3b includes two elements 4a and 4b each supporting one side of the winding 3. The mirror 2 rests on an edge 12 represented by dots.

The elastic support illustrated in FIG. 3c includes two elements 4a and 4b each of which is fixed onto an inside face of the winding 3.

Figure 4:
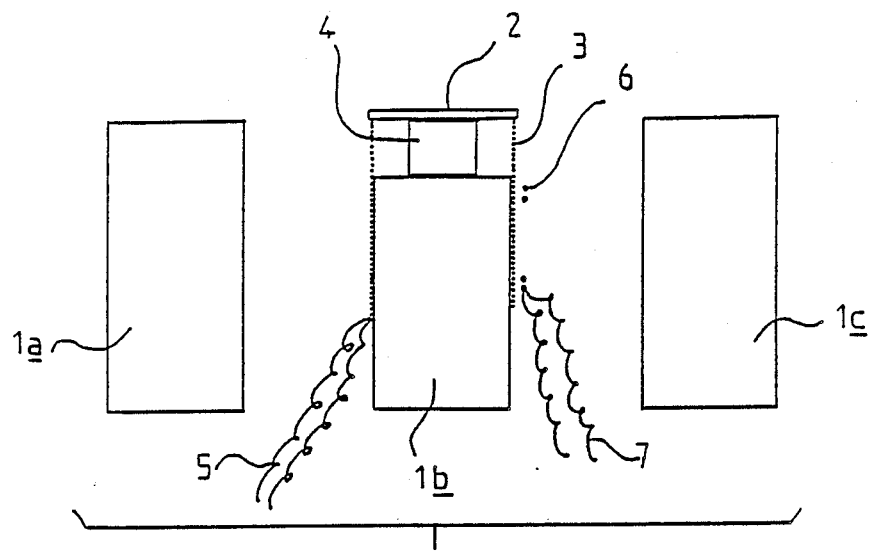
FIG. 4 is a schematic view of a device according to the invention, with a secondary winding.

As illustrated in FIG. 4, the middle magnet 1b is crowned with an elastic support 4 which supports, while being interdependent with it, the mirror 2. The mirror 2 is bound up with a winding 3. The winding 3 is in the shape of a rectangular parallelepiped and supplied with current by electrical wires 5.

One of the faces of the winding 3 (located in one of the two interferric spaces, in this case the space formed by the magnets 1b and 1c) includes a secondary interdependent winding 6. The winding 6 is connected by two electrical wires 7 to a slaving device (not illustrated).

Figure 5:
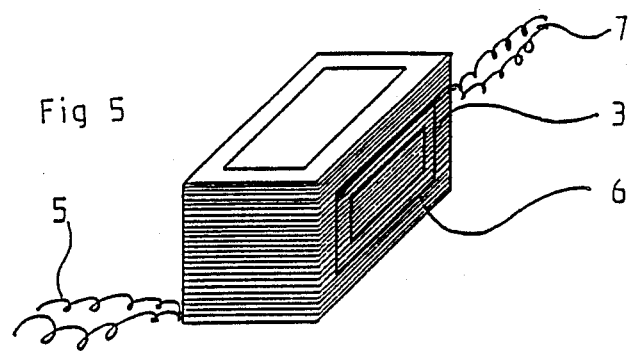
FIG. 5 is a three quarter view of the windings illustrated in FIG. 4.

If we then refer to FIG. 5 we see the main winding 3 with a rectangular parallelepiped shape extended by electrical wires 5, bearing on one of its sides the secondary winding 6 whose shape is rectangular and whose spiral plane is strictly perpendicular to the planes formed by the main winding spires 3.

This relationship between the windings 3 and 6 is such that the current supplied to the main winding 3 does not induct any current in the secondary winding 6, the only current appearing in the winding 6 is the current inducted by the displacement of the assembly in the magnetic field created by the magnets.

Figure 6:
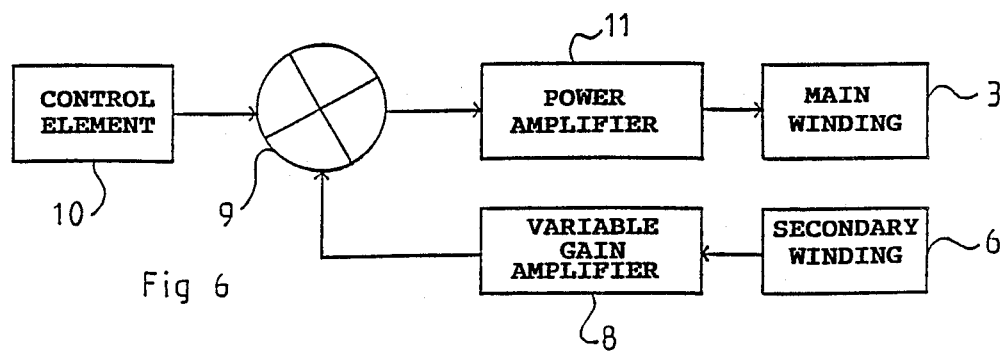
FIG. 6 is a synoptic diagram of the operation of the device of FIG. 4.

As illustrated in FIG. 6, the current induced in the secondary winding 6 is applied to a variable gain amplifier 8. The output voltage of the amplifier 8 is applied to a voltage subtractor 9 which receives (through another input) the order from the control element 10.

The output voltage from the subtractor 9 is applied to a power amplifier 11 whose output supplies the main winding 3.

Thus, the secondary winding 6 creates an electronic brake for instantaneously adjusting the supply of current to the main winding 3, thereby avoiding over-oscillations or over-damping.

As an example, the device of FIG. 1 may be formed of three calcine plates of Neodymium-steel 10 mm long, 10 mm high and 3 mm thick, the middle plate being underslung by 1 mm in relation to the two external plates and being crowned with a 10 mm long polyurethane support, 1 mm high and 1 mm thick. A silicium mirror 2/10 mm thick is fixed onto the support with cyanoacrylate ester base glue. The mirror is fixed by glue to a 4 mm high winding made of 100 spires of enamelled copper wire 4/100 mm in diameter, the winding capping the middle plate.

The resistance of the winding is approximately 50 ohms. The maximum admissible voltage is 10 volts, for a current of 0.2 A. The result is a power peak of 2 watts.

The piloting means required for this device are linear amplifiers which are able to dissipate power in the range of 2 watts.

A triangular electric signal is applied to the device for uniform sweeping in time, the absolute value of the angular speed of the mirror being uniform.

Such disposition may allow the digitalization of images by the means of a beam deviated by two mirrors arranged in such a manner as to be able to sweep the axis X of a plane with one and with the other, the axis Y of the same plane.

Thus if we apply to the winding for the mirror which sweeps the axis X a signal constituted by a ramp of 256 steps and to the winding of the mirror which sweeps the axis Y a triangular signal whose half-period corresponds to one step of the preceding signal, we digitalize an image in 256 half-periods. If F' designates the sweeping frequency on Y we can digitalize an image of 256×256 points in a time equal to 128/F'

When F'=3000 Hz, this digitalization can be realized in 128/3000−4.2/100 s., in transmission or in reception.

Preferably, the small winding 6 is constituted of two parallel spires forming a rectangle 8 mm long and 2 mm high. The small winding is fixed on one of the sides of the main winding by glue.

The small winding is connected to a piloting electronic system integrating a variable gain amplifier and a voltage subtractor, itself connected via a power amplifier to the main winding. This arrangement confers remarkable reliability and reproducibility to the device.

The addition of a secondary winding thus allows surpassing the constraints related to the reproduction of elastic supports thus allowing the realization of systems that do not over-oscillate or over-damp.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

We claim:

1. A device for deviating an electromagnetic beam, the device comprising:
    a mirror for reflecting the electromagnetic beam;
    first, second and third magnets for generating a magnetic field, the second magnet being located between the first and third magnets;
    a main winding which is located within the magnetic field and which is fixed to the mirror;
    an elastic support for elastically supporting the mirror with respect to the second magnet; and
    means for supplying electric current through the winding to cause the mirror to oscillate with respect to the first, second and third magnets.

2. The device of claim 1, wherein the magnets generate a high intensity magnetic field, the magnets being formed of a material with an energy power of more than 100 kj/m$^3$, the magnets being parallel to each other.

3. The device of claim 1, wherein the elastic support contacts the mirror, the winding and the second magnet.

4. The device of claim 1, wherein the elastic support includes two elastic support elements, the elastic support elements being fixed to the winding.

5. The device of claim 4, further comprising a support edge which is located between the mirror and the second magnet, the elastic support elements being fixed to bottom portions of the winding.

6. The device of claim 4, wherein the elastic support elements are fixed to the winding and to the second magnet.

7. The device of claim 1, wherein the elastic support is fixed to the mirror by glue, the glue including cyanoacrylate ester.

8. The device of claim 1, wherein the magnets are formed of Neodymium steel.

9. The device of claim 1, wherein the magnets form a magnet assembly which is generally E-shaped.

10. The device of claim 1, wherein the elastic support is made from an elastic material which has a high damping coefficient.

11. The device of claim 10, wherein the elastic material is polyurethane.

12. The device of claim 1, wherein the elastic support is made from an elastic material which has a low damping coefficient, the device further comprising controlling means for controlling the oscillation of the mirror.

13. The device of claim 1, further comprising a secondary winding, the secondary winding being smaller than the main winding, the secondary winding being fixed with respect to a face of the main winding, the secondary winding being located between the second and third magnets, the windings being arranged such that current supplied through the main winding does not induce current through the secondary winding, the device further comprising slave mode means associated with the secondary winding for controlling the oscillation of the mirror.

14. The device of claim 13, wherein the secondary winding is rectangular.

15. The device of claim 14, wherein the slave mode means includes a digital control system.

16. The device of claim 14, wherein the slave mode means includes an analog control system.

17. The device of claim 16, wherein the analog control system includes a variable gain amplifier, a voltage subtractor, a control element and a power amplifier, an output of the secondary winding being supplied to the variable gain amplifier, an output of the variable gain amplifier being supplied to the voltage subtractor, an output of the control element being supplied to the voltage subtractor, an output of the voltage subtractor being supplied to the power amplifier, an output of the power amplifier being supplied to the main winding.

* * * * *